United States Patent
Lin et al.

(10) Patent No.: US 6,187,645 B1
(45) Date of Patent: *Feb. 13, 2001

(54) METHOD FOR MANUFACTURING SEMICONDUCTOR DEVICE CAPABLE OF PREVENTING GATE-TO-DRAIN CAPACITANCE AND ELIMINATING BIRDS BEAK FORMATION

(75) Inventors: Tony Lin, Kaohsiung Hsien; Coming Chen, Taoyuan Hsien; Jih-Wen Chou, Hsinchu, all of (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/233,354

(22) Filed: Jan. 19, 1999

(51) Int. Cl.⁷ ................................................. H01L 21/336
(52) U.S. Cl. ......................... 438/305; 438/303; 438/595
(58) Field of Search ................................... 438/301, 303, 438/305, 306, 307, 595

(56) References Cited

U.S. PATENT DOCUMENTS

| | | | |
|---|---|---|---|
| 4,935,379 | * | 6/1990 | Toyoshima ............................. 437/44 |
| 5,547,885 | * | 8/1996 | Ogoh ...................................... 437/44 |
| 5,770,508 | * | 6/1998 | Yeh et al. ............................. 438/305 |
| 5,817,563 | * | 10/1998 | Lim ...................................... 438/307 |

* cited by examiner

Primary Examiner—Charles Bowers
Assistant Examiner—Jack Chen

(57) ABSTRACT

A method for manufacturing semiconductor device. The method includes the steps of providing a substrate that has a gate structure thereon, and then forming offset spacers on the sidewalls of the gate structure. Thereafter, a thin oxide annealing operation is conducted, and then a first ion implantation is carried out using the gate structure and the offset spacers as a mask to form lightly doped drain regions in the substrate. Subsequently, secondary spacers are formed on the exterior sidewalls of the offset spacers. Finally, a second ion implantation is carried out using the gate structure, the offset spacers and the secondary spacers as a mask to form source/drain regions within the lightly doped drain regions.

10 Claims, 4 Drawing Sheets

METHOD FOR MANUFACTURING SEMICONDUCTOR DEVICE CAPABLE OF PREVENTING GATE-TO-DRAIN CAPACITANCE AND ELIMINATING BIRDS BEAK FORMATION

BACKGROUND OF THE INVENTION

1. Field of Invention

The present invention relates to a method for manufacturing integrated circuit. More particularly, the present invention relates to a method for manufacturing metal oxide semiconductor (MOS) device.

2. Description of Related Art

As techniques for fabricating semiconductor devices continue to develop, MOS devices having a smaller line width can be formed on a larger size wafer. Hence, integrated circuit having powerful functions is possible at a lower production cost. At present, sub-quarter-micron (0.25 μm) size devices are routinely fabricated. However, as the dimensions of a device get smaller, channel length of a MOS device will also be reduced. Therefore, problems caused by having a short channel will intensify.

One common method of resolving short channel effect is to form a lightly doped region in the source/drain region of a MOS device next to the channel. This type of arrangement is referred to as forming a lightly doped drain (LDD) structure.

As dimensions of a MOS device shrink, it becomes more difficult to control the process of forming a LDD structure in the MOS device. In addition, the annealing and thermal operation operations carried out after the formation of the LDD structure can easily lead to the diffusion of ions from the lightly doped region into the substrate underneath the gate structure. Hence, a structure similar to a stacked capacitor is ultimately formed through the combination of the lightly doped drain structure in the substrate, the gate oxide layer and the gate conductive layer. When appropriate bias voltages are applied to the MOS device, a gate-to-drain capacitance (Cgd) will be developed in the area between the gate conductive layer, the gate oxide layer and the LDD region. The gate-to-drain capacitance can lead to abnormal bias and a reduction of alternating current (AC) performance of the device. Hence, the gate of the device will have a higher switching delay.

FIGS. 1A through 1C are cross-sectional views showing the progression of manufacturing steps according to a conventional method of forming a MOS device with a lightly doped drain structure.

First, as shown in FIG. 1A, a substrate 100 having a gate structure thereon is provided. The gate structure 102 includes a gate oxide layer 104 and a gate conductive layer 106. Thereafter, using the gate structure 102 as a mask, an ion implantation 108 is carried out implanting ions into the substrate 100 to form lightly doped drain (LDD) regions 110.

Next, as shown in FIG. 1B, spacers 112 are formed on the sidewalls of the gate structure 102. In the subsequent step, using the spacers 112 and the gate structure 102 as a mask, a second ion implantation 114 is carried out implanting ions into the substrate 100. Finally, source/drain regions 116 each having a LDD region 110 are formed.

As the dimensions of a MOS device is reduced, it will be difficult to control the parameters necessary for forming a LDD region 110 inside a source/drain region 116. In addition, subsequent thermal annealing operations may be required. Due to the diffusion of ions from the LDD region 110 into the substrate 100 underneath the gate structure 102 (region 118 in FIG. 1C), a structure similar to a capacitor is formed. The capacitor structure is formed through the combination of the LDD region 110, the gate oxide layer 104 and the gate conductive layer 106. When appropriate bias voltages are applied to the MOS device, a gate-to-drain capacitance (Cgd) will be developed in the area between the gate conductive layer 106, the gate oxide layer 104 and the region 118. The gate-to-drain capacitance can lead to abnormal bias and a reduction of alternating current (AC) performance of the device. Hence, the gate 102 will have a higher switching delay.

To reduce the gate-to-drain capacitance (Cgd), offset spacers each having a thickness of about 0.015 μm is formed on the sidewalls of the gate structure prior to the implantation of ions into the substrate to form the LDD structure. The offset spacers can prevent the over-diffusion of ions from the LDD region into neighboring substrate region underneath the gate structure. Hence, the gate-to-drain capacitance resulting from the gate conductive layer, the gate oxide layer and the source/drain region can be eliminated.

FIGS. 2A through 2C are cross-sectional views showing the progression of manufacturing steps according to a conventional method of forming a MOS device with offset spacers on the sidewalls of a gate structure.

First, as shown in FIG. 2A, a substrate 200 is provided. Then, a gate structure 202 is formed over the substrate 200. The gate structure 202 includes a gate oxide 20 layer 204 and a gate conductive layer 206. The gate structure has a cross-sectional width 207 of about 0.25 μm. Thereafter, a thin oxide annealing operation 208 is carried out to anneal the substrate 200 and the gate structure 202 at a temperature of about 800° C. Consequently, any crystal defects on the substrate 200 surface and within the gate structure 202 will be cleared away due to the re-crystallization of internal lattice structure. However, because of the high-temperature annealing operation, bird's beaks will form at the interface between the gate oxide layer 204 and the gate conductive layer 206.

Next, as shown in FIG. 2B, offset spacers 210 are formed on the sidewalls of the gate structure 202. The offset spacer can be a silicon dioxide layer having a thickness 211 of about 0.015 μm.

Next, as shown in FIG. 2C, using the gate structure 202 and the offset spacers 210 as a mask, an ion implantation is carried out implanting ions into the substrate to form lightly doped drain region 212. Thereafter, another spacers 214 are formed on the exterior sidewalls of the offset spacers 210. Finally, using the gate structure 202, the offset spacers 210 and the spacers 214 as a mask, a second ion implantation is carried out implanting ions into the substrate 200 to form source/drain regions 216.

Since the ion implantation operation for forming the LDD region 212 is performed only after the offset spacers 210 are formed, ionic diffusion from the LDD region 212 to the substrate will be buffered by the offset spacer. In other words, the ions in the LDD region 212 have to diffuse across the entire thickness of the offset spacer before reaching the substrate 200 underneath the gate structure 202. Therefore, the number of ions capable of diffusing into the substrate underneath the gate structure 202 is reduced considerably. The reduction of ions in that area will minimize the gate20 to-drain capacitance established through the combination of gate conductive layer 206, the gate oxide layer 204 and the source/drain region 216.

However, bird' beaks 218 are formed at the interface between the gate conductive layer 206 and the gate oxide layer 204 due to the thin oxide annealing operation at about 800° C. The presence of bird's beaks 218 will make the thickness of the gate oxide layer 204 highly irregular and resulting in a change in threshold voltage of the device. Hence, the gate-to-drain capacitance (Cgd) formed by the gate conductive layer, the gate oxide layer and the channel region will be unstable. consequently, the switching delay of each gate will vary leading to poor device quality.

In addition, each offset spacer 210 has a thickness of about 0.015 μm (as shown in FIG. 2B), and that offset spacers 210 are formed on each side of the gate structure 202. Since the gate structure 202 has a width of about 0.25 μm, the overall with of the final gate structure is about 0.28 μm. Hence, the addition of the offset spacers 210 will tend to increase the channel region 220 (as shown in FIG. 2C) underneath the gate structure 202 from 0.25 μm to 0.28 μm. Because a longer channel length will have a higher resistance, there will be a reduction in potential current flowing through the channel. Consequently, efficiency of the device will be lowered.

In light of the foregoing, there is a need to provide an improved method for forming MOS device.

SUMMARY OF THE INVENTION

Accordingly, the present invention is to provide a method for manufacturing semiconductor device capable of preventing the generation of gate-to-drain capacitance (Cgd) in a MOS device.

In another aspect, this invention is to provide a method for manufacturing semiconductor device capable of eliminating bird's beak formation at the interface between the gate oxide layer and the gate conductive layer, thereby increasing the efficiency of the device.

In yet another aspect, this invention is to provide a method for manufacturing semiconductor device capable of eliminating the effect of having a longer channel length resulting from the formation of offset spacers on the sidewall of the gate structure.

To achieve these and other advantages and in accordance with the purpose of the invention, as embodied and broadly described herein, the invention provides a method for manufacturing semiconductor device. The method includes the steps of providing a substrate that has a gate structure thereon such that the width of the gate structure is about 0.22 μm. Next, offset spacers each having a thickness of about 0.015 μm is formed on the sidewalls of the gate structure. Thereafter, a thin oxide annealing operation is carried out at a temperature of about 800° C. Then, using the gate structure and the offset spacers as a mask, an ion implantation is carried out implanting ions into the substrate to form lightly doped drain regions. Subsequently, secondary spacers are formed on the exterior sidewalls of the offset spacers. Finally, using the gate structure, the offset spacers and the secondary spacers as a mask, a second ion implantation is carried out implanting ions into the substrate to form source/drain regions.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
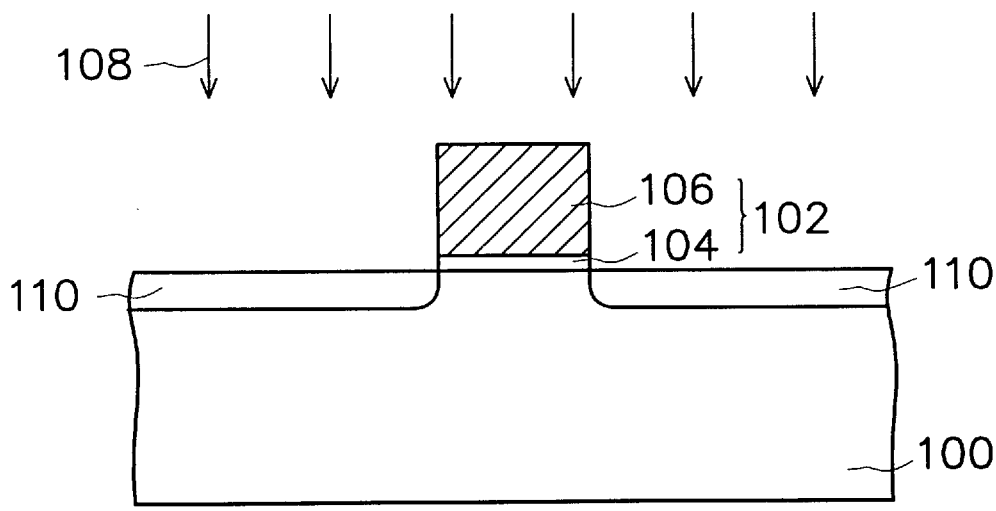
FIGS. 1A through 1C are cross-sectional views showing the progression of manufacturing steps according to a conventional method of forming a MOS device with lightly doped drain structures.
Figure 1B:
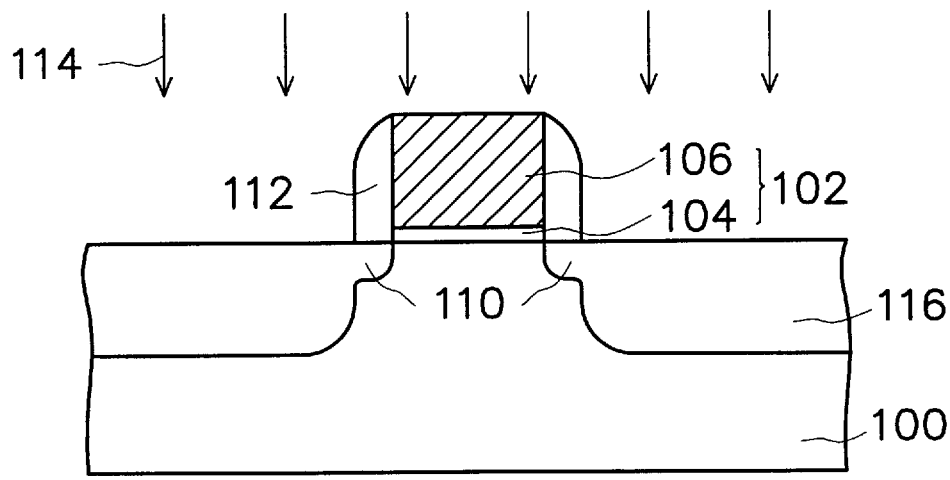
Figure 1C:
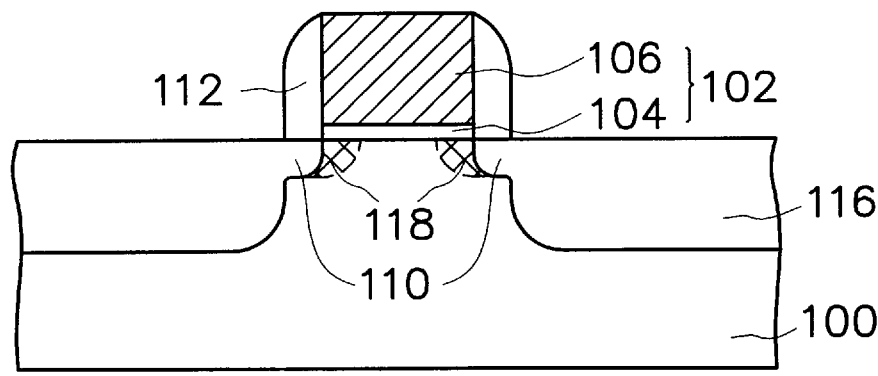
Figure 2A:
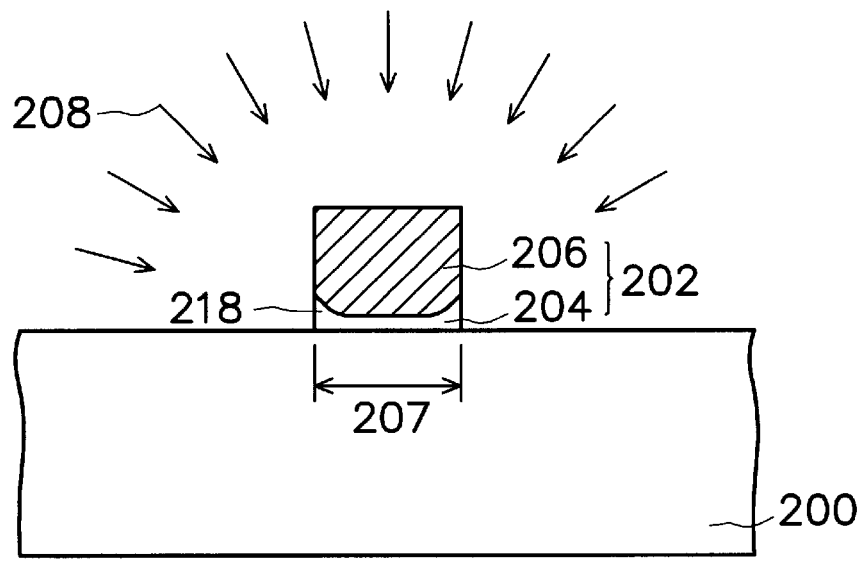
FIGS. 2A through 2C are cross-sectional views showing the progression of manufacturing steps according to a conventional method of forming a MOS device with offset spacers on the sidewalls of a gate structure.
Figure 2B:
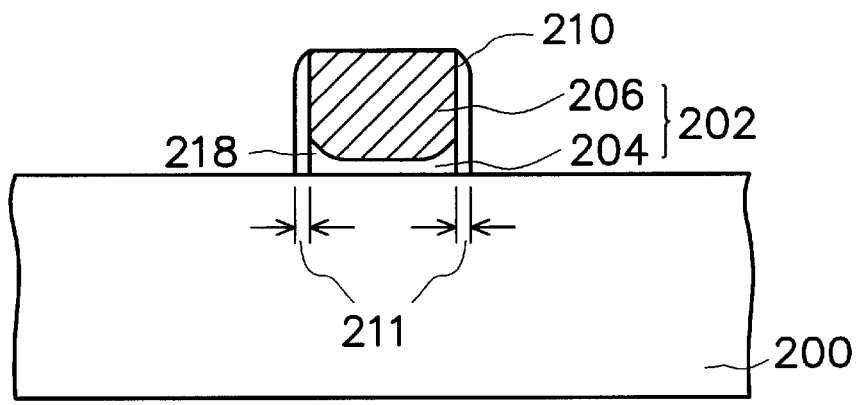
Figure 2C:
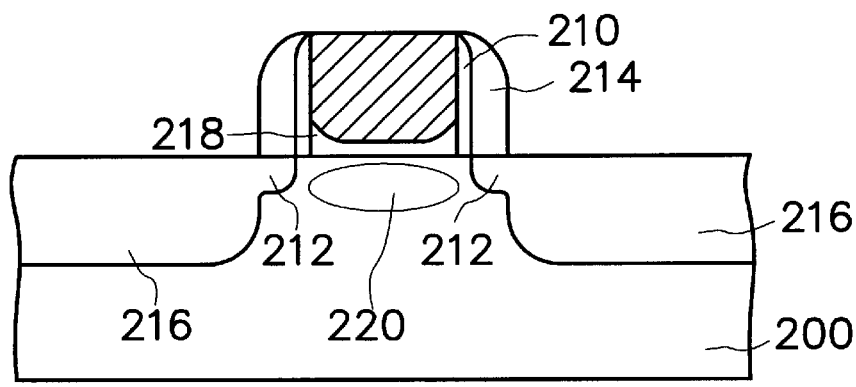

Reference will now be made in detail to the present preferred embodiments of the invention, examples of which are illustrated in the accompanying drawings. Wherever possible, the same reference numbers are used in the drawings and the description to refer to the same or like parts.

FIGS. 3A through 3E are cross-sectional views showing the progression of manufacturing steps for forming a MOS device according to one preferred embodiment of this invention.

Figure 3A:
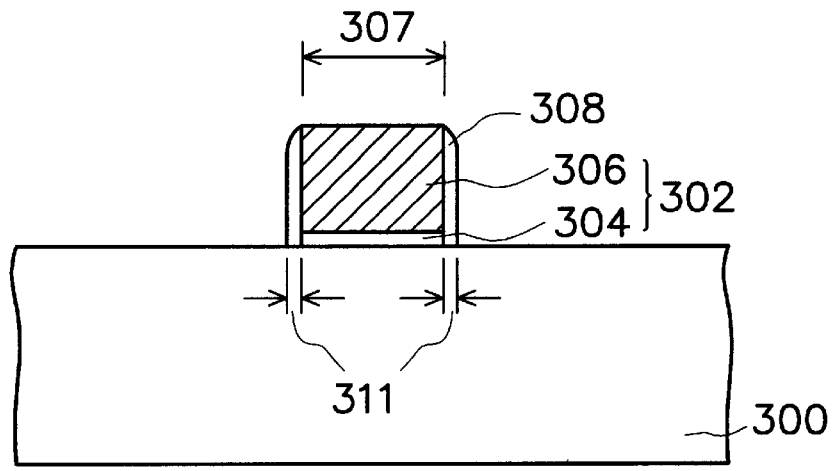
FIGS. 3A through 3E are cross-sectional views showing the progression of manufacturing steps for forming a MOS device according to one preferred embodiment of this invention.

First, as shown in FIG. 3A, a substrate 300 having a gate structure 302 thereon is provided. The gate structure 302 includes a gate oxide layer 304 and a gate conductive layer 306. The gate structure 302 has a width 307 of about 0.22 μm. Thereafter, offset spacers 308 each having a thickness 311 of about 0.015 μm are formed on the sidewalls of the gate structure 302. The offset spacers 308 can be a silicon dioxide or a silicon nitride layer. The offset spacers 308 can be formed, for example, by performing a chemical vapor deposition (CVD) operation to deposit a dielectric layer over the substrate 300, and then performing an anisotropic etching operation to etch back the dielectric layer.

Figure 3B:
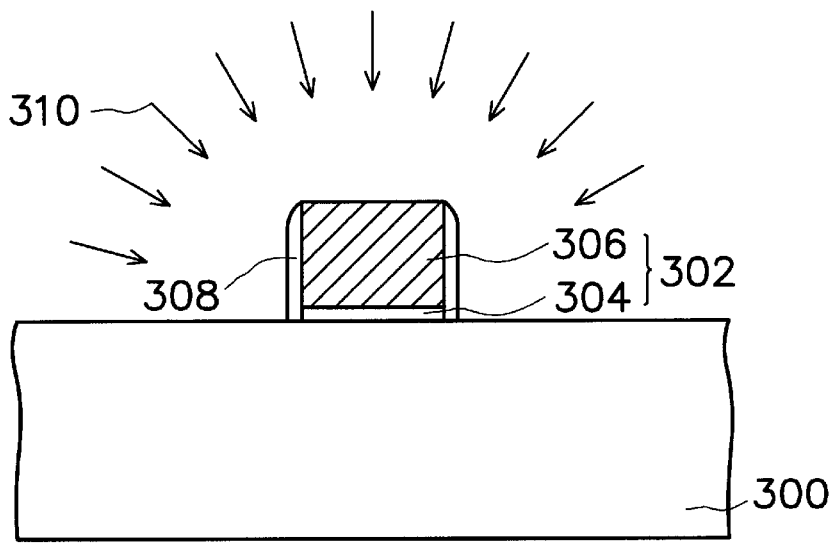

Next, as shown in FIG. 3B, a thin oxide annealing operation 310 is conducted to anneal the substrate 300 and the gate structure 302 at a temperature of about 800° C. Consequently, any crystal defects on the substrate 300 surface and within the gate structure 302 will be cleared away due to the re-crystallization of internal lattice structure. Due to the presence of offset spacers 308 over the sidewalls of the gate structure 302, no bird's beaks are formed at the interface between the gate oxide layer 304 and the gate conductive layer 306 during the annealing operation.

Figure 3C:
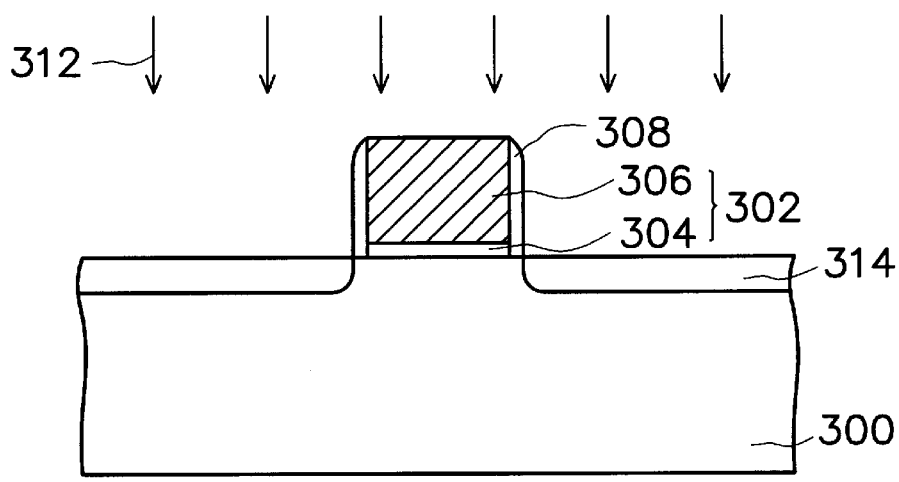

Next, as shown in FIG. 3C, using the gate structure 302 and the offset spacers 308 as a mask, a first ion implantation 312 is carried out implanting ions into the substrate to form lightly doped drain (LDD) regions 314. For example, arsenic or phosphorus ions can be implanted into the substrate 300 to form the LDD regions 314. Due to the presence of offset spacers 308, the doped ions in the LDD regions 314 is difficult to enter the substrate region underneath the gate structure 302 by thermal diffusion. Consequently, gate-to-drain capacitance (Cgd) resulting from the arrangement of the gate conductive layer 306, the gate oxide layer 304 and the LDD regions 314 can be greatly reduced.

Figure 3D:
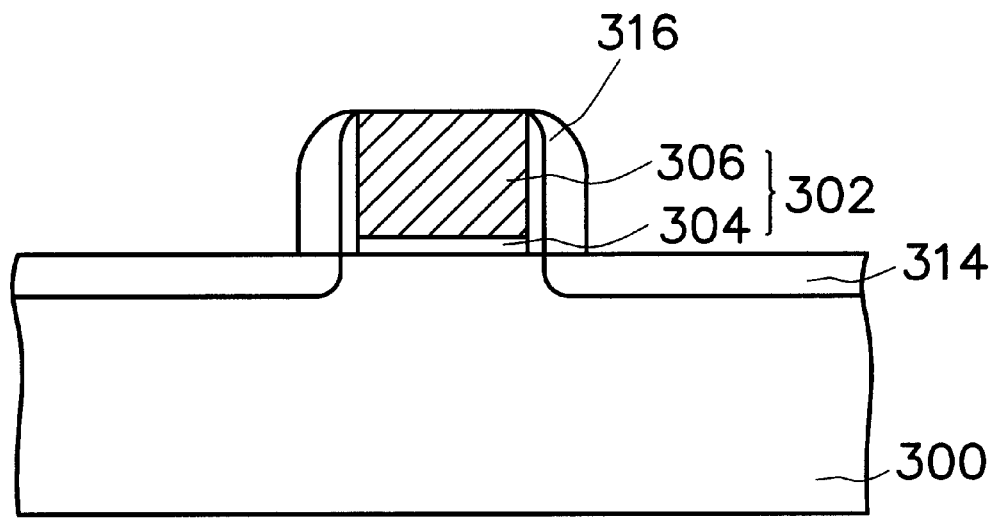

Next, as shown in FIG. 3D, secondary spacers 316 are formed on the exterior sidewalls of the offset spacers 308. For example, the secondary spacers 316 can be a silicon dioxide layer or a silicon nitride layer. The secondary spacers can be formed by performing a chemical vapor deposition (CVD) operation to deposit a dielectric layer over the substrate 300, and then performing an anisotropic etching operation to etch back the dielectric layer.

Figure 3E:
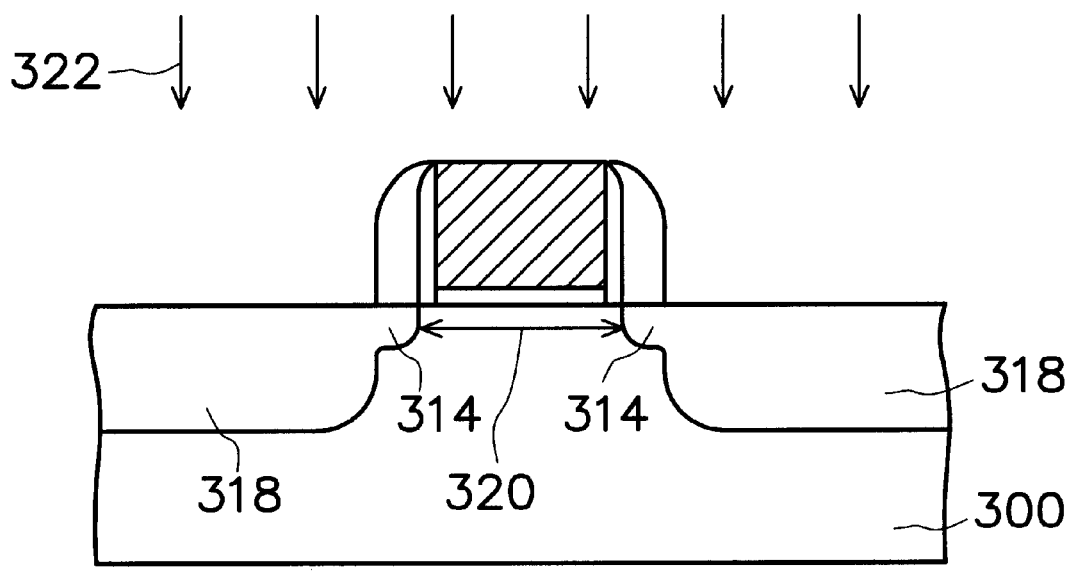

Finally, as shown in FIG. 3E, using the secondary spacers 316 and the gate structure 302 as a mask, a second ion implantation 322 is carried out implanting ions into the substrate 300. Hence, source/drain regions 318 are formed inside the LDD regions 314.

According to the method of this invention, offset spacers each having a thickness of about 0.015 μm is formed on the sidewalls of the gate structure. The offset spacers serve as a buffer preventing the direct diffusion of doped ions in the LDD region into the substrate underneath the gate structure. Therefore, the gate-to-drain (Cgd) capacitance formed by the arrangement of the gate conductive layer, the gate oxide layer and the source/drain regions is greatly reduced.

In addition, the offset spacers can protect the gate structure during the high-temperature thin oxide annealing operation. The offset spacers can prevent the formation of uneven gate oxide thickness within the gate structure due to the formation of bird's beaks at the interface between the gate oxide layer and the gate conductive layer. Since an uneven gate oxide thickness can lead to a change in threshold voltage and instability in gate switching time, a uniform thickness in the gate oxide layer can improve the efficiency of the device.

Furthermore, the gate structure has a width of about 0.22 μm while each offset spacers has a thickness of about 0.015 μm, hence the total width of the gate structure including the two offset spacers is about 0.25 μm. Therefore, length of the channel region underneath the gate structure will be reduced from the 0.28 μm to just 0.25 μm. With a shorter channel length, channel resistance will be lowered and hence a higher current can flow. Consequently, the device will have a higher operating efficiency. Although a channel length of 0.25 μm is used in the embodiment of this invention, channel length smaller than 0.25 μm can also be implemented in this invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a MOSFET, comprising the sequential steps of:

providing a substrate having a gate structure thereon, wherein the gate structure has a plurality of sidewalls, and wherein the substrate and the gate structure have crystal defects;

forming offset spacers on the sidewalls of the gate structure, wherein the offset spacers have a plurality of exterior sidewalls;

performing an annealing operation after the offset spacers are formed, wherein the annealing operation eliminates the crystal defects;

performing a first ion implantation using the gate structure and the offset spacers as a mask to form lightly doped drain regions in the substrate;

forming secondary spacers on the exterior sidewalls of the offset spacers; and performing a second ion implantation using the gate structure, the offset spacers and the secondary spacers as a mask to form source/drain regions in the substrate.

2. The method of claim 1, wherein the annealing operation is carried out at a temperature of about 800° C.

3. The method of claim 1, wherein the gate has a width of about 0.22 μm.

4. The method of claim 1, wherein each the offset spacers has a thickness of about 0.015 μm.

5. The method of claim 1, wherein the step of forming offset spacers includes depositing silicon dioxide.

6. A method for manufacturing semiconductor device, comprising the sequential steps of:

providing a substrate having a gate structure thereon, wherein the gate structure has a plurality of sidewalls, and wherein the substrate and the gate structure have crystal defects;

forming offset spacers on the sidewalls of the gate structure;

performing an annealing operation after the offset spacers are formed and before ion implantation processes, and wherein the annealing operation eliminates the crystal defects; and performing an ion implantation using the gate structure and the offset spacers as a mask to form lightly doped drain regions in the substrate.

7. The method of claim 6, wherein the annealing operation is carried out at a temperature of about 800° C.

8. The method of claim 6, wherein the gate has a width of about 0.22 μm.

9. The method of claim 6, wherein each of the offset spacer has a thickness of about 0.015 μm.

10. The method of claim 6, wherein the step of forming offset spacers includes depositing silicon dioxide.

* * * * *